United States Patent
Van Engelen et al.

(10) Patent No.: US 9,537,502 B2
(45) Date of Patent: *Jan. 3, 2017

(54) METHOD AND APPARATUS FOR CALIBRATION OF A TIME INTERLEAVED ADC

(71) Applicant: Luxtera, Inc., Carlsbad, CA (US)

(72) Inventors: Josephus Van Engelen, Carlsbad, CA (US); Aaron Buchwald, Carlsbad, CA (US); Ralph Duncan, Carlsbad, CA (US)

(73) Assignee: Entropic Communications, LLC, Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/858,793

(22) Filed: Sep. 18, 2015

(65) Prior Publication Data

US 2016/0191071 A1    Jun. 30, 2016

Related U.S. Application Data

(63) Continuation of application No. 14/322,514, filed on Jul. 2, 2014, now Pat. No. 9,143,149.

(Continued)

(51) Int. Cl.
*H03M 1/06* (2006.01)
*H03M 1/38* (2006.01)
(Continued)

(52) U.S. Cl.
CPC ............. *H03M 1/38* (2013.01); *H03M 1/0678* (2013.01); *H03M 1/124* (2013.01);
(Continued)

(58) Field of Classification Search
CPC ........ H03M 1/0695; H03M 1/44; H03M 1/46; H03M 1/462; H03M 1/38; H03M 1/121; H03M 1/124; H03M 1/0836; H03M 1/14
(Continued)

(56) References Cited

U.S. PATENT DOCUMENTS 5,771,012 A    6/1998 Shu
6,784,814 B1   8/2004 Nair
(Continued)

OTHER PUBLICATIONS

PCT, Notification of Transmittal of the International Search Report and the Written Opinion of the International Searching Authority, or the Declaration, in International application No. PCT/US2015/023847, dated Jul. 10, 2015 (15 pages).
(Continued)

*Primary Examiner* — Khai M Nguyen
(74) *Attorney, Agent, or Firm* — McAndrews, Held & Malloy

(57) ABSTRACT

A system for calibrating time interleaved ADCs is disclosed and may include a time interleaved analog-to-digital converter (ADC) for converting analog signals to digital signals, the time interleaved ADC comprising: a plurality of active slices, and a plurality of reference slices, each reference slice associated with a corresponding one of the plurality of active slices. An output of each reference slice may be used to correct distortion in an output of the corresponding active slice. Each active slice may sample an input signal at a first rate and each associated reference slice may sample the input signal at a second rate, the second rate being slower than the first rate. Each sample taken by one of the plurality of reference slices may then be taken concurrent with a sample taken by the associated active slice. Each reference slice may include a reference sampling module and a dummy load.

23 Claims, 15 Drawing Sheets

Related U.S. Application Data

(60) Provisional application No. 61/973,739, filed on Apr. 1, 2014.

(51) Int. Cl.
  *H03M 1/12* (2006.01)
  *H03M 1/08* (2006.01)
  *H03M 1/14* (2006.01)

(52) U.S. Cl.
  CPC ........ *H03M 1/1215* (2013.01); *H03M 1/0836* (2013.01); *H03M 1/14* (2013.01)

(58) Field of Classification Search
  USPC .................................. 341/118, 155, 161–163
  See application file for complete search history.

(56) References Cited

U.S. PATENT DOCUMENTS

| | | |
|---|---|---|
| 7,158,066 B2 | 1/2007 | Lee |
| 7,250,885 B1 * | 7/2007 | Nairn .................. H03M 1/1215 341/141 |
| 7,880,660 B2 | 2/2011 | Sutardja |
| 8,159,377 B2 * | 4/2012 | Goldman ............ H03M 1/0624 341/118 |
| 8,344,927 B2 | 1/2013 | Jeon |
| 8,519,875 B2 * | 8/2013 | Straayer .............. H03M 1/1057 341/120 |
| 2009/0243907 A1 * | 10/2009 | Nazemi ............... H03M 1/1042 341/161 |

OTHER PUBLICATIONS

International Preliminary Report on Patentability corresponding to International Patent Application No. PCT/JS2015/023847, mailed Oct. 13, 2016.

* cited by examiner

PRIOR ART

PRIOR ART

PRIOR ART

METHOD AND APPARATUS FOR CALIBRATION OF A TIME INTERLEAVED ADC

RELATED APPLICATIONS

This application is a continuation of application Ser. No. 14/322,514 filed on Jul. 2, 2014, which claims priority benefit of U.S. Provisional Application Ser. No. 61/973,739 filed Apr. 1, 2014 and entitled "METHOD AND APPARATUS FOR CALIBRATION OF A TIME INTERLEAVED ADC." Each of the above stated applications is hereby incorporated herein by reference in its entirety.

TECHNICAL FIELD

The disclosed method and apparatus relate to analog to digital converters, and more particularly to time interleaved analog to digital converters.

BACKGROUND OF THE INVENTION

Over the past several decades, the electronics field has been moving rapidly toward using digital techniques for handling information. In particular, signals that are initially analog signals are being digitized to allow those signals to be managed, processed and otherwise handled in the digital domain. The advantages of handling signals in the digital domain which have driven this movement are well known to those skilled in the art.

As a consequence of the desire to handle signals in the digital domain, there is a need for analog to digital converters (ADCs) to convert analog signals to the digital signals (i.e., to digitize such analog signals). One type of analog to digital converter, called a successive approximation register (SAR) ADC uses a series of iterative steps to determine a digital value that represents the amplitude of an analog signal.

FIG. 1A is a simplified schematic of a conventional SAR ADC 100. The SAR ADC 100 comprises a successive approximation register (SAR) 102, a digital to analog converter (DAC) 104, a comparator 106 and a track and hold amplifier circuit (THA) 108. An input signal 110 is applied to the THA 108. The THA 108 outputs a signal having a stable amplitude equal to the amplitude of the input signal 110 averaged over the time the sample was taken. The output signal 109 from the THA 108 is then applied to the positive input of the comparator 106. The negative input to the comparator 106 is coupled to the analog output of the DAC 104. The analog output 107 of the DAC 104 is determined by the state of the digital value Di, ... D. applied to the input of the DAC 104. The value Di, ... D. is output from the SAR 102 to the DAC 104.

When the ADC 100 starts operating, the SAR 102 is initialized to output a digital value that is equal to half the full scale value of the ADC 100. A reference signal 103 applied to the ADC 100 from an external source defines the magnitude of the full scale output. The most significant bit (MSB) of the SAR (Do) is set to 1 and each of the other bits (D1, D2, ... Dn_1) are set to 0. Accordingly, the DAC 104 will output a signal with an amplitude that is half the magnitude of the full scale output. A sample clock 110 provided by the SAR 102 is synchronized with a clock signal 105. The clock signal 105 indicates when the THA 108 is to sample the input 110. Typically, the SAR 102 is a state machine that controls the ADC process.

The comparator 106 compares that amplitude of the signal 107 output by the DAC 104 with the amplitude of the sample 109 of the input signal. If the sample 109 has an amplitude greater than or equal to the value output 107 from the DAC 104, then the output 111 from the comparator 106 is set high and applied to the SAR 102. The clock signal 105 sets the timing for the SAR. The sample clock 112 is derived from the clock signal 105. The clock signal 105 to the SAR 102 will indicate when the value output from the comparator is stable. The SAR 102 will then store that value as the value of the MSB. The SAR 102 will then set the next most significant bit DN_1 to 1 and the process repeats until a determination is made for each bit of the SAR output.

Once the value of each bit of the SAR has been determined, an End of Conversion (EOC) signal 114 indicates the completion of the process and the value output by the SAR 102 can be read. This value will then represent the amplitude of the input signal to a resolution determined by the number of bits in the ADC 100 (i.e., the number n of bits output from the SAR 102 and input to the DAC 104).

FIG. 1B is a simplified block diagram of another type of ADC, commonly known as a "pipeline" ADC 101. In a pipeline ADC 101, the conversion from analog to digital format occurs in stages. An input signal 110 is applied to a THA 120 within the first stage. The sampled input 122 is then coupled to the input of a course sub-ADC 124. The sub-ADC 124 provides a three-bit digital representation of the sampled input signal 122. The three-bit output from the sub-ADC 124 is coupled to the input of a multiplying DAC (MDAC) 126. The MDAC 126 converts the three bits back to an analog signal 128. The output 128 is then coupled to a subtraction circuit 129 that subtracts the difference between the output 128 and the sampled input 122. The difference is then applied to an amplifier 131 that provides a gain of 2", where n is equal to 2 in this case. The amplifier brings the difference back in the range of a second stage of the pipeline ADC 101.

The second stage and each subsequent stage functions identically to the first stage. The output from the sub-ADC 124 of each stage is coupled to a Combine/Process module 130 that combines the output from each stage and does any processing required to correct the output. Other types of ADCs are known as well, including sigma-delta ADCs, etc.

The speed at which current ADCs can operate has been steadily increasing, thus allowing higher and higher frequencies to be digitized. One technique currently used to increase the speed of an ADC involves the use of a set of interleaved individual ADCs.

FIG. 2 is a simplified block diagram of a time interleaved ADC 200. FIG. 3 is a timing diagram for the ADC 200. Time interleaved ADCs use a set of parallel ADCs (frequently referred to as "slices"). Each slice 202, 204, 206, 208 comprises essentially the configuration shown in either FIG. 1A or FIG. 1B. Note that while the examples provided for time interleaved ADCs are shown for SAR ADCs or pipeline ADCs, this would apply for any ADC architecture as well.

Referring to FIG. 3, a master clock 301 runs at a rate that is at least equal to the Nyquist frequency (i.e., twice the highest frequency of the input signal to be digitized). In an ADC 200 that has M slices, a slice sample cycle 303 occurs at the rate at which samples are taken by each slice. In the example shown, Mmaster clock cycles 305 occur during one "sample cycle" 303 at the slice sample rate. In the case shown in FIGS. 2 and 3, there are four slices. Each slice runs at the master clock rate fN divided by the number of slices M (i.e., fN/M). Accordingly, the slice sample rate 303 is one fourth the master clock rate. In addition, each slice is offset in phase by 1/M with a duty cycle that is equal to 1/M. In some cases, the slice clocks run at a 50% duty cycle and the sample time is triggered by an edge of the slice clock and lasts only for that portion of the time during which the other slices are not sampling (i.e., each slice samples for 1/M of the total sample cycle).

Upon completing the conversion of the analog input signal to a digital output from each slice, the output is coupled to a Reconstruction Interleaver 218 which combines the outputs to form a coherent output that digitally represents the analog input signal 110. That is, the output 210, 212, 214, 216 of each slice is interleaved to create a digital representation of one sample cycle of the analog signal 110.

Accordingly, the rate at which the data can be sampled is increased by a multiple equal to the number of slices provided. That is, if M individual ADCs are interleaved, then the rate of the time interleaved ADC is M times the rate of each slice.

One problem that results from the use of time interleaved ADCs is that a correction has to be added to the output 210, 212, 214, 216 of each slice to correct for differences in the gain and offset of each slice 202, 204, 206, 208. That is, differences in the gain and offset of the various slices will cause distortion in the overall output of the time interleaved ADC 200. In addition, differences in sample time also cause distortion.

One way in which the prior art attempts to resolve this problem is to provide a reference slice that samples the input at the same time as the other slices. Since the problem is due to differences in gain and offset between the slices, the problem can be resolved by making the gain and offset of each slice equal. By using an independent slice as a reference, the gain and offset of each slice can be normalized to a value that is the same for each slice with respect to the reference slice. Accordingly, distortion in the interleaved output of an ADC can be reduced.

FIG. 4 is a simplified block diagram of an interleaved ADC 400 with a reference slice 401.

FIG. 5 is a timing diagram of the interleaved ADC 400 shown in FIG. 4.

The reference slice 401 samples the input signal at the same time as one of the active slices 402, 404, 406, 408. The term "active" is used merely to distinguish those slices termed "active slices" that generate the digitized output signal from the reference slice.

The reference slice 401 runs at a slower speed than the active slices 402, 404, 406, 408. In FIG. 5, the reference slice clock 501 runs approximately one half the speed of the active slice clocks 511, 513, 515, 517. Accordingly, the first two samples are taken by the reference slice 401 M master clock cycles apart and concurrent with the samples taken at times 519, 521 by the first active slice 402. As shown in FIG. 5, M is equal to 8. This causes the reference slice 401 to take a first sample at a first reference sample time 503 that is concurrent with a first active sample time 519 taken by the first active slice 402. A second sample is taken by the reference slice 401 at a second reference sample time 505 concurrent with a third sample taken by the first active slice 402 at a third sample time 521. In other cases, M is equal to 12, 16 or any other multiple of the number of active slices, depending upon how much slower the reference slice is with respect to the active slices.

In the case shown in FIG. 5, the reference slice 401 takes two samples concurrent with the first active slice 402. The reference slice 401 then waits M+1 cycles before taking the next sample at reference sample time 507. Waiting one additional cycle, shifts the reference sample time to be concurrent with the sample time 523 of the next active slice 404. The reference slice 401 takes two samples concurrent with each active slice and moves on to the sample time of the next active slice. Therefore, the reference slice 401 rolls through the active slice sample times in round robin fashion. The fact that the reference slice 401 need not sample at a high rate is advantageous, since reducing the processing speed of the reference slice reduces the cost and the amount of power required to operate the ADC 400. In the example of FIG. 5, the reference slice 401 takes two samples concurrent with the each active slice before taking samples concurrent with the next active slice. Alternatively, for a slower reference slice, M can be a multiple of four greater than 8. Accordingly, the reference slice 401 takes a sample once for every M/4 times that the active slice 401 takes a sample.

It should be noted that a reference THA (not shown) will track the sample for the same amount of time as, and concurrent with, one of the active THAs (not shown). This is so even though the reference slice 401 processes the sample slower. Furthermore, in one example, the reference slice 401 takes 8 reference samples over 128 master clock cycles (i.e., one every 16 clock cycles over 128 clock cycles), rather than just 2 samples over 16 master clock cycles, as shown in FIG. 5. In this case, it should be noted that the first active slice 402 will take 4 samples for each one sample taken by the reference slice 401. Those 8 reference samples are digitized and each resulting digital output is compared to the corresponding digital output resulting from the slice sample taken at the same time by the first active slice 402. The differences between the 8 reference measurements and the 8 active slice samples can then be averaged (or otherwise weighted and combined) to determine the difference between the first active slice 402 and the reference slice 401. After taking the 8 reference samples concurrent with the first active slice 402, the reference sample time of the reference slice 401 is shifted by one master clock cycle to coincide with the slice sample time of the second active slice 404. Once again, the reference slice 401 will take 8 reference samples over a period of 128 slice sample cycles (one every 16 slice sample cycles) concurrent with the samples taken by the second active slice 404. This will be repeated for the other two active slices 406, 408.

The Reconstruction Interleaver 410: (1) receives the output from the reference slice; (2) receives the output from each of the active slices 402, 404, 406, 408; and (3) calculates a correction to be applied to each of the active slices 402, 404, 406, 408 based on the average difference between the sample taken by the reference slice and the sample taken by the active slice at the same time.

It should be noted that the order in which the active slices 402, 404, 406, 408 sample the input can be pseudo random or may follow a pattern other than what is shown.

One problem with this approach is that the loading of the input signal (i.e., the loading on the input to each slice 402, 404, 406, 408) changes when the reference slice 401 is sampling the input in coincidence with sampling by an active slice 402, 404, 406, 408. This causes the value of the sample taken by the active slices 402, 404, 406, 408 to be slightly different from the value of that would have been sampled without the loading of the reference slice 401. This difference causes distortion due to the difference between the values of the samples from sample to sample. That is, in the example shown in FIG. 5, the reference slice 401 only samples the signal once for every two samples taken by the active slice. Therefore, there is a difference in the load on the input of each active slice 402, 404, 406, 408 when the reference slice 401 is sampling concurrent with an active slice 402, 404, 406, 408 and when the reference slice 401 is not sampling concurrent with an active slice 402, 404, 406, 408.

In addition, there is a difference in the measurement taken when the reference slice 401 is sampling concurrent with the first active slice 402 and the time the reference slice 401 is sampling concurrent with the second active slice 404, etc. Accordingly, there is presently a need for an ADC that can perform fast digitization of high frequency analog signals while reducing the resulting distortion.

BRIEF SUMMARY OF THE INVENTION

A system and/or method for calibration of a time interleaved ADC, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

The disclosed method and apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

Figure 1A:
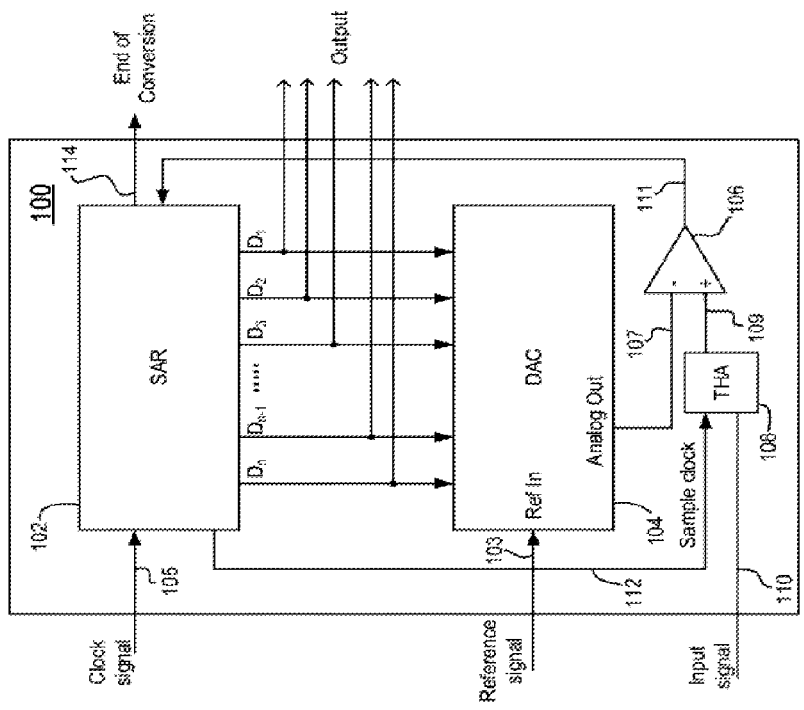
FIG. 1A is a simplified block diagram of a conventional successive approximation register (SAR) analog to digital converter (ADC).

The figures are not intended to be exhaustive or to limit the claimed invention to the precise form disclosed. It should be understood that the disclosed method and apparatus can be practiced with modification and alteration, and that the invention should be limited only by the claims and the equivalents thereof

DETAILED DESCRIPTION OF THE INVENTION

Various embodiments of a method and apparatus for making corrections to the output from an active slice of an interleaved analog to digital converter (ADC) are disclosed.

In accordance with one embodiment of the disclosed method and apparatus, each active slice has a portion of a reference slice associated with it. In one embodiment, the portion is integrated into the active slice. In one such embodiment, that portion consists of a track and hold amplifier circuit (THA). In an alternative embodiment, a sample and hold circuit is used instead of the THA. Throughout the following discussion, the term "sample", "sampled", "sampling", etc. are used. It should be understood that a THA tracks the signal that is presented to the input of the THA for a period of time and then holds the value for some additional amount of time. Nonetheless, the term "sample" and derivatives of that term should be understood to apply to the tracked output of the THA as well.

In one embodiment, the THA is dedicated to taking reference samples of the input signal concurrent with the sampling done by the active slice. In one such embodiment, an integrated reference THA samples at a substantially slower rate than the slice rate at which the active slice takes samples and processes them. A simulated reference THA is switched in and the reference THA is switched out during times when the reference THA is not taking samples (i.e., when the reference THA is maintaining the sample for processing by a slower shared reference SAR and DAC). Accordingly, the simulated reference THA is connected to and disconnected from the input signal to ensure that the load on the input signal is the same for each active slice at each sample time. The load imposed by the simulated THA is ideally equal to the load imposed by the reference THA. In another embodiment, a sample is taken by the reference THA each time a sample is taken by the active slice, eliminating the need for the simulated reference THA.

In another embodiment, a reference slice is associated with each active slice. In one embodiment, the reference slice is integrated into each active slice. In one such embodiment, the reference THA within each active slice samples at a substantially slower rate than the rate at which the THA of the active slices samples. A simulated THA is switched in and the reference THA is switched out during times when the reference THA is not taking samples. The load imposed by the simulated THA is ideally equal to the load imposed by the reference THA. In another embodiment, the reference slice within each active slice operates continuously to take samples at the same rate as the active slice, thus eliminating any distortion that might occur due to uneven loading of the input during sampling by the active slice.

In an alternative embodiment, a reference slice includes a plurality of reference slice input modules, each reference slice input modules is dedicated to sampling an input signal concurrent with an active slice. In another embodiment, the reference THA within each reference slice input modules samples at a substantially slower rate than the rate at which the active slices sample. A simulated THA is switched in and the reference THA is switched out during times when the reference THA is not taking samples. The load imposed by the simulated THA is ideally equal to the load imposed by the reference THA.

Figure 6:
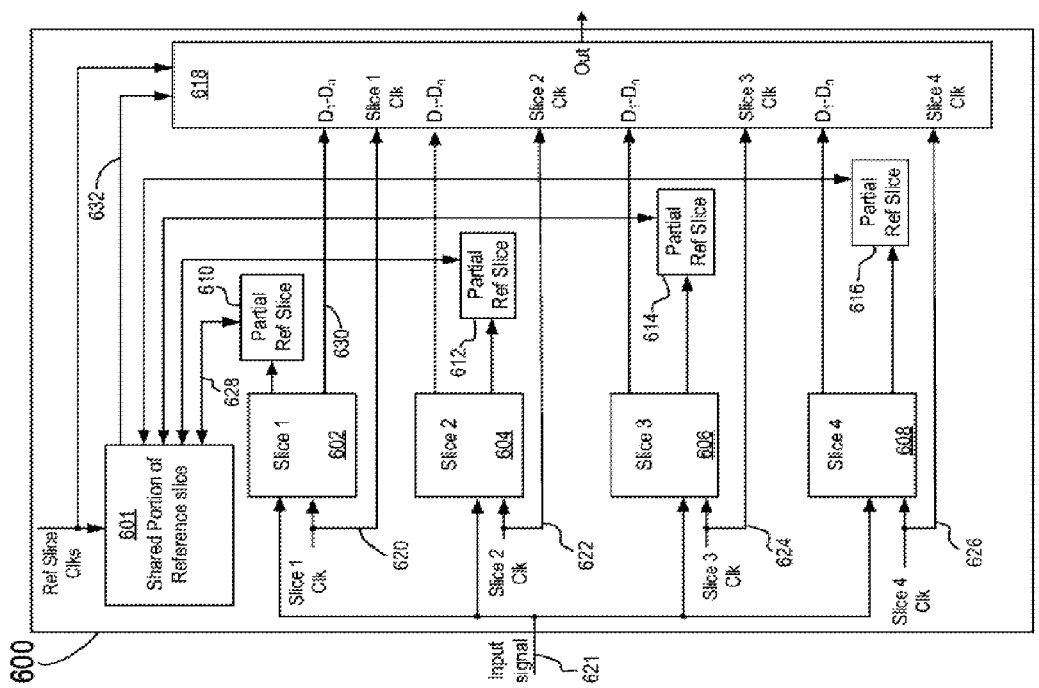
FIG. 6 is a simplified block diagram of a time interleaved ADC in which a portion of the reference slice is integrated into each active slice in accordance with one embodiment of the disclosed method and apparatus.

FIG. 6 is a simplified block diagram of a time interleaved analog to digital converter (ADC) 600 in accordance with one embodiment of the presently disclosed method and apparatus. The ADC 600 has a shared portion of a reference slice 601, a plurality of active slices 602, 604, 606, 608, a plurality of partial reference slices 610, 612, 614, 616 and a Reconstruction Interleaver 618. Each partial reference slice 610, 612, 614, 616 is associated with a corresponding active slice 602, 604, 606, 608. The details of one of the active slices 602 and the associated partial reference slice 610 are discussed with respect to FIG. 7. The details of the shared portion of the reference slice 601 are discussed with respect to FIG. 8. FIG. 9 is a timing diagram of some of the signals associated with the ADC 600. The reference slice (i.e., the combination of the shared portion of the reference slice 601 and at least one of the partial reference slices 602, 604, 606, 608) provide a reference measurement that can be used by the reconstruction interleaver 618 to reduce distortion that would otherwise occur due to differences between the active slices. That is, by comparing reference measurements taken by the reference slice to measurement taken by each active slice at the same time as the measurement taken the active slices, differences between the measurements taken by the reference slice and the active slices can be used to determine the difference between the measurements taken by each active slice. These differences can then be calibrated out.

Figure 4:
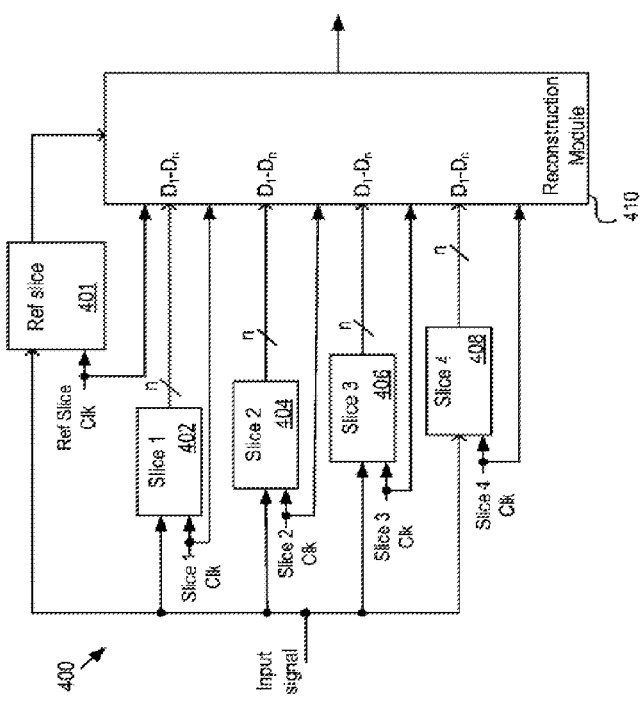
FIG. 4 is a simplified block diagram of a conventional time interleaved ADC having a reference slice.
Figure 5:
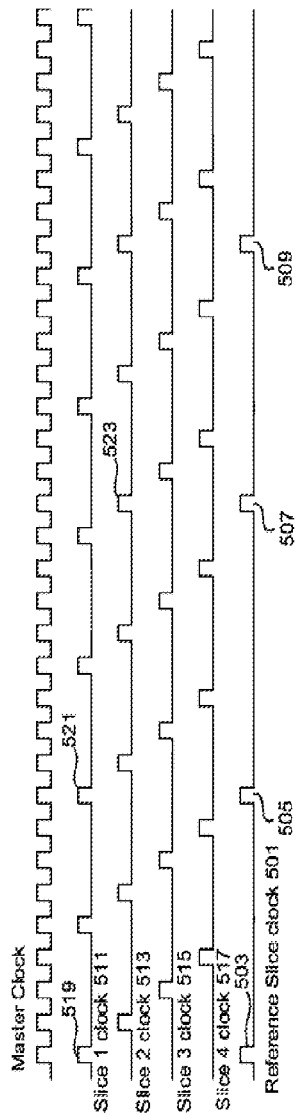
FIG. 5 is a timing diagram of the signals associated with the time interleaved SAR ADC of FIG. 4.

Initially, an input signal 621 to be converted from analog form to digital form is provided from an external source (not shown) to the ADC 600. That input signal 621 is coupled to each of the active slices 602, 604, 606, 608. Each active slice 602, 604, 606, 608 outputs an uncorrected n-bit output that digitally represents the amplitude of the input signal 621. The timing of the interleaved ADC 600 is similar to that described with respect to the interleaved ADC 400 shown in FIG. 4 and the timing diagram of FIG. 5. Referring to FIG. 9, each active slice 602, 604, 606, 608 receives a slice clock (Slice 1 Clk 620, Slice 2 Clk 622, Slice 3 Clk 624 and Slice 4 Clk 626). Each slice clock 620, 622, 624, 626 is offset in time from each other slice clock so that each active slice 602, 604, 606, 608 will sample the input signal 621 at a unique time slot. It should be noted that the particular order in which each active slice 602, 604, 606, 608 samples could be other than the order shown. For example, in one embodiment, the order can be pseudo random or may follow a pattern other that what is shown in FIG. 9.

Figure 7:
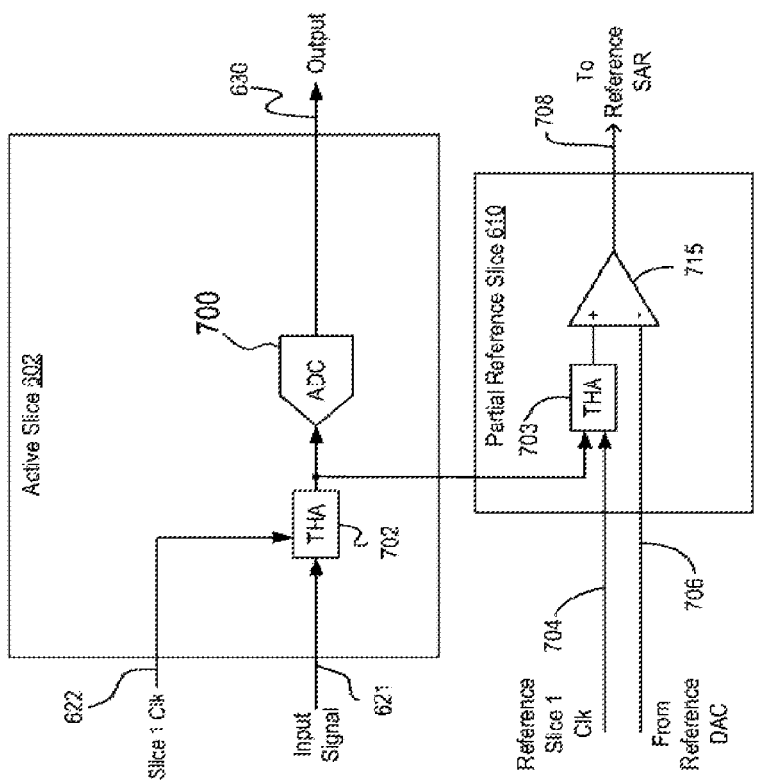
FIG. 7 is a simplified block diagram of an active slice and a partial reference slice used in the time interleaved ADC of FIG. 6.

Refer now to FIG. 7, which illustrates the details of one embodiment of an active slice 602 and a partial reference slice 610. Each active slice 602, 604, 606, 608 is essentially identical. Likewise, each partial reference slice 610, 612, 614, 616 is essential identical. Accordingly, the description of active slice 602 and partial slice 610 of FIG. 7 applies equally to each of the other active slices 604, 606, 608 and partial reference slices 612, 614, 616.

Figure 1B:
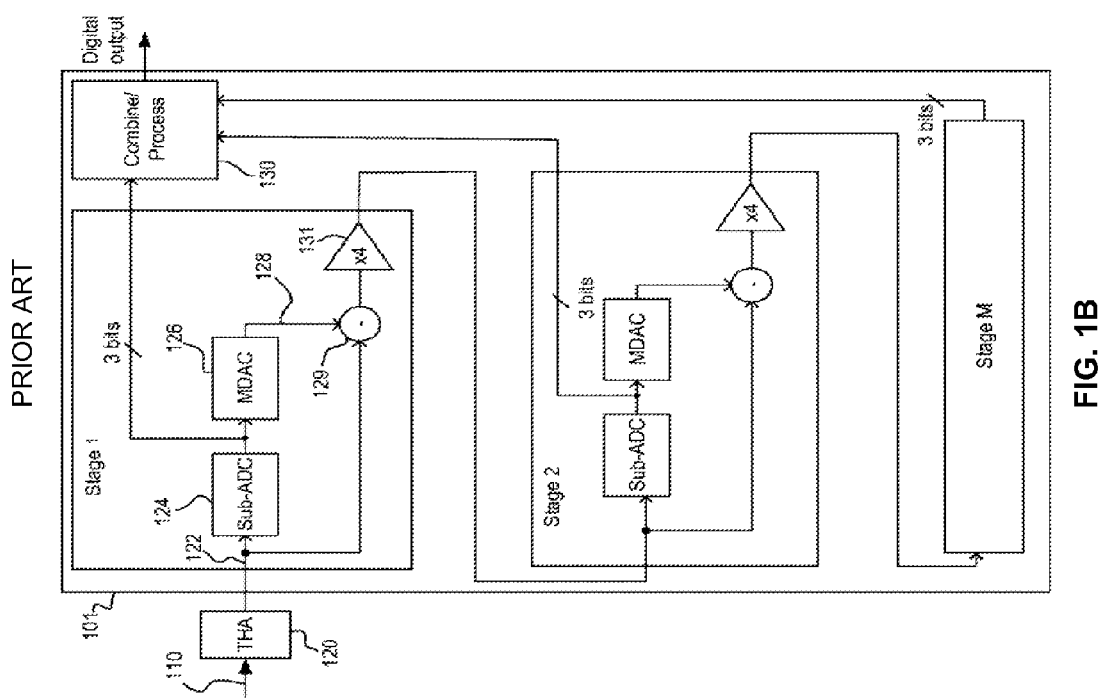
FIG. 1B is a simplified block diagram of a conventional pipeline ADC.
Figure 2:
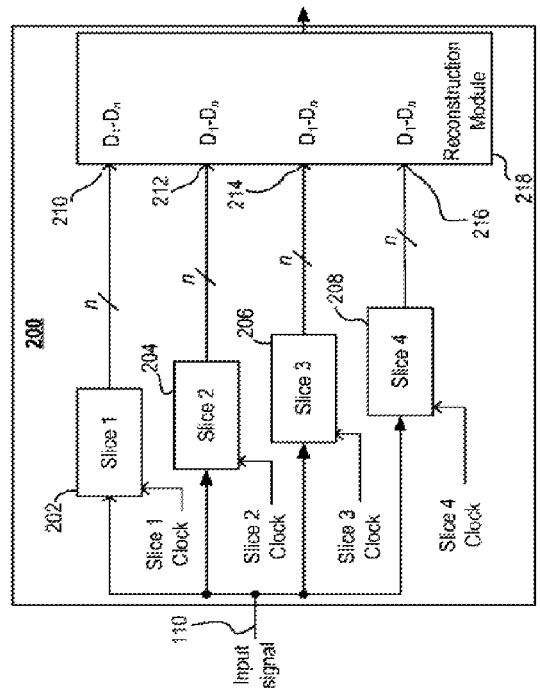
FIG. 2 is a simplified block diagram of a conventional time interleaved ADC.
Figure 3:
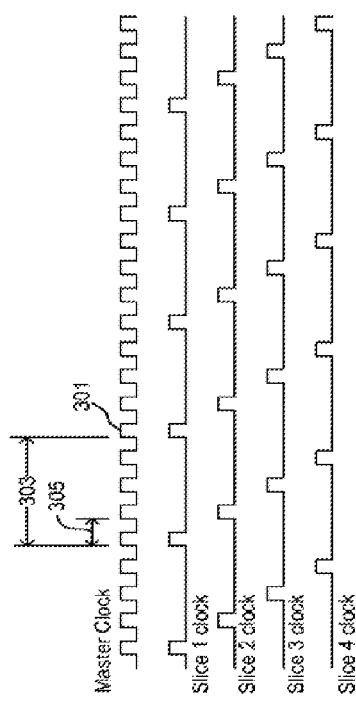
FIG. 3 is a timing diagram of the signals associated with the time interleaved ADC of FIG. 2.

In accordance with one embodiment of the disclosed method and apparatus, an active ADC 700 is a pipeline ADC similar to the pipeline ADC 101 shown in FIG. 1B. However, those skilled in the art will understand that the active ADC 700 may take any form, such as a SAR ADC, sigma-delta ADC, etc. Furthermore, throughout the disclosure, reference is made to track and hold amplifier circuits (THA). Those skilled in the art will understand that the circuit could alternatively be a sample and hold circuit or any other sampling module that provides a means for capturing the amplitude of the input signal. In the embodiment of the disclosed method and apparatus shown in FIGS. 6-9, each active slice 602, 604, 606, 608 is associated with a corresponding partial reference slice 610, 613, 614, 616. In one such embodiment, each partial reference slice 610, 612, 614, 616 is integrated into the associated active slice 602, 604, 606, 608. Alternatively, each partial reference slice 610, 612, 614, 616 is discrete from each associated active slice 602, 604, 606, 608.

An active THA 702 within the active slice 602 receives the input signal 621. The slice 1 Clk 620 provides timing for the samples of the input signal 621 taken by the THA 702. The samples output from the THA 702 are coupled to the input to the ADC 700. The output 630 from the ADC 700 is provided to the Reconstruction Interleaver 618 shown in FIG. 6.

In one embodiment of the disclosed method and apparatus, the output of the THA 702 is also coupled to the input of a THA 703 within the partial reference slice 610 associated with the active slice in which the THA 703 resides. Accordingly, the samples taken by the partial reference slice 610 are samples of the samples taken by the associated active slice. Alternatively, the input to the THA 703 can be taken from the input signal directly. However, in some embodiments of the disclosed method and apparatus, a timing adjustment is made at the THA 702 to correct for minor discrepancies between the slice clocks 620, 622, 624, 626. By taking the input of the THA 703 from the output of the THA 702, the timing of the partial reference slice 610 can be adjusted concurrent with the timing of the active slice 602.

It should be noted that the partial reference slice 610 receives two inputs (i.e., the reference slice 1 clock 704 and a DAC output 706) from the shared portion of the reference slice 601. In addition, the partial reference slice 610 provides one output (comparator output 708) to the shared portion of the reference slice 601. These signals are shown in a single bi-directional line 628 in FIG. 6 for the sake of clarity in the figure. However, each of these signals is shown in detail in FIGS. 7 and 8.

In accordance with one embodiment of the disclosed method and apparatus, the partial reference slice 610 samples at a rate determined by the reference slice 1 clock 704 (see FIG. 9). The reference slice 1 clock 704 runs slower than the Slice 1 clock 620 that determines the times at which the active THA 702 takes samples. The reference slice 1 clock 704 synchronizes the operation of the shared portion of the reference slice 601 to the partial reference slice 610. In one embodiment of the disclosed method and apparatus, each of the clocks (i.e., the reference slice 1 clock 704, the slice 1 clock 620, etc.) are generated from a common clock generator (not shown). However, for the sake of simplicity and clarity of the figures, the origin of these clocks are not shown. In one embodiment of the disclosed method and apparatus, these clocks may also be synchronized to the input signal. Each reference slice clock 704, 903, 905, 907 is synchronized with the associated active slice clock 620, 622, 624, 626 such that each partial reference slice 610, 614, 616 takes samples concurrent with samples taken within the associated active slice 602, 604, 606, 608.

Figure 8:
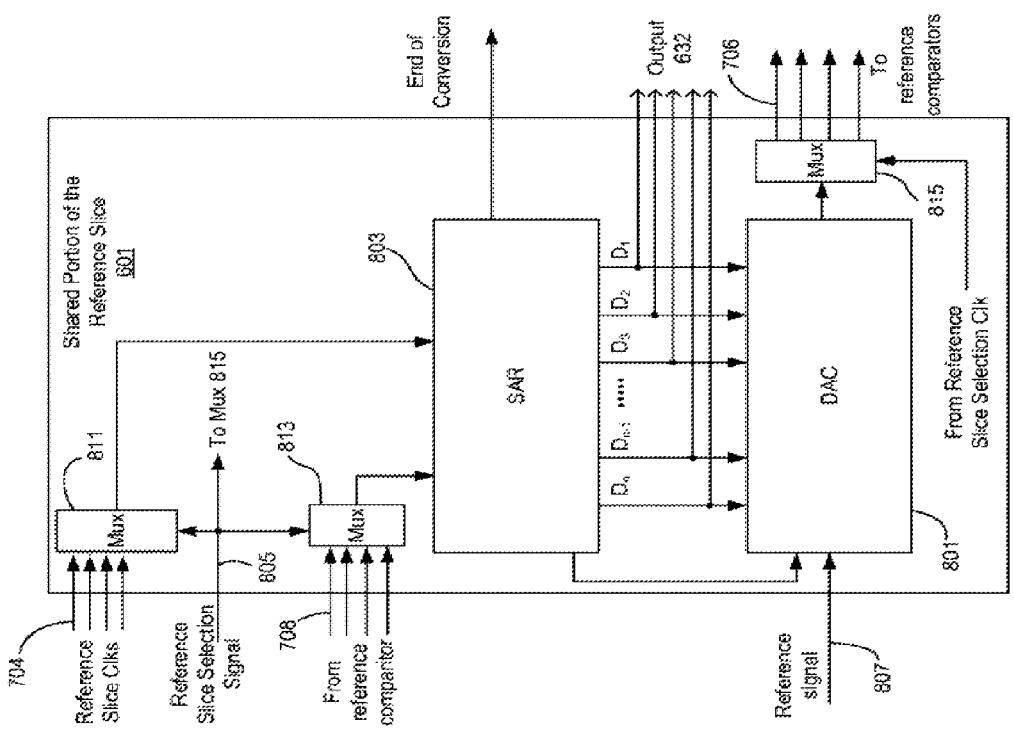
FIG. 8 is a simplified block diagram of a shared portion of a reference slice used in the ADC of FIG. 6.
Figure 9:
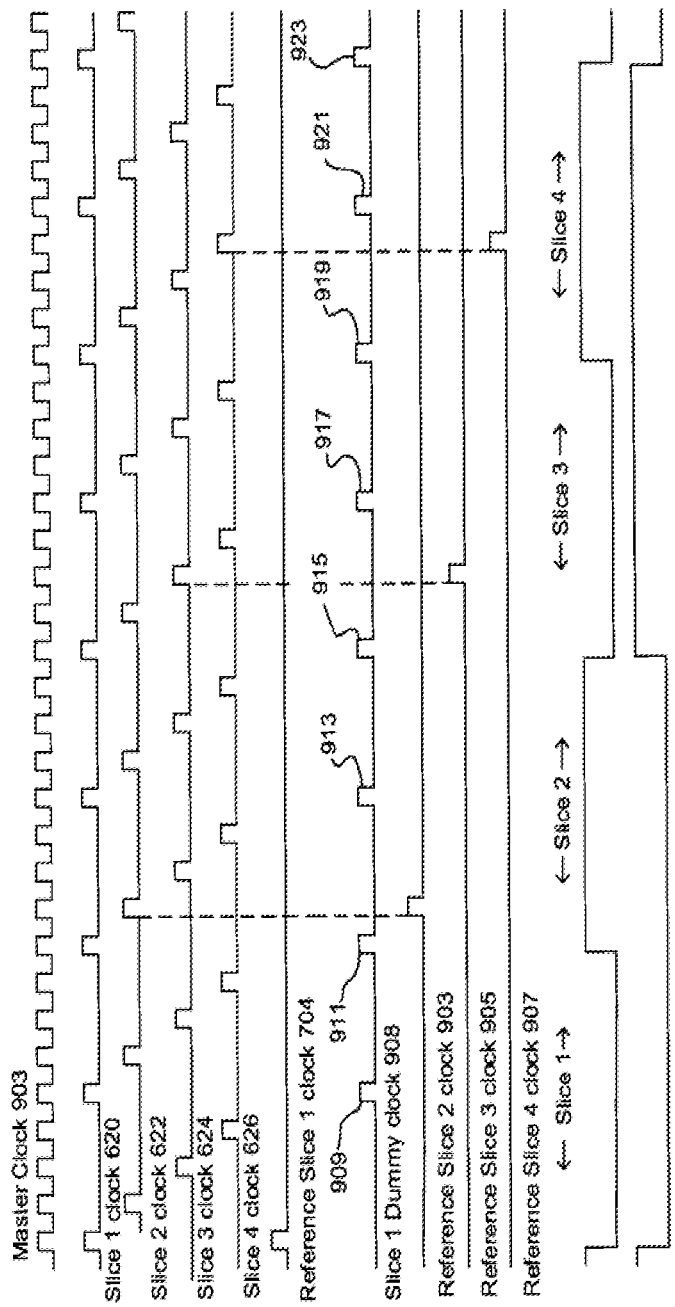
FIG. 9 is a timing diagram showing the timing of the interleaved ADC of FIG. 6.

Refer now to FIG. 8, in which the shared portion of the shared reference slice 601 is shown. The reference slice is essentially a SAR ADC that operates similar to that described with regarding to FIG. IA. However, the shared portion of the reference slice 601 is shared among each of the partial reference slices 610, 612, 614, 616. Accordingly, a reference ADC is comprised of the shared portion of the reference slice 601 and one of the partial reference slices 610, 612, 616. The SAR 803 operates essentially as was described with regard to the SAR 102 discussed with respect to FIG. IA. However, because it is shared, a reference slice selection signal 805 is provided to indicate which partial reference slice 610, 612, 614, 616 is being handled by the shared portion of the reference slice 601 at any particular time. In accordance with an alternative embodiment of the disclosed method and apparatus, the components and functions of the reference ADC can be divided between the shared portion of the reference slice 601 and the partial reference slice 610, 612, 614, 616. The particular components and/or functions depends in part on the particular type of ADC used to implement the reference ADC. For example, in the embodiment shown in FIGS. 7 and 8, in which the reference ADC is implemented as a SAR ADC, the SAR 803 and DAC 801 are shared, while the comparator 715 resides within the partial reference slice 610, 612, 614, 616. However, other divisions of the components are possible within a reference SAR ADC. In other embodiments, a bias block, a reference ladder, and/or clocking circuitry are shared. Those skilled in the art will understand that implementation of such sharing will depend upon the particular conditions under with the interleaved ADC will be required to operate and the type of ADC being used. In embodiments in which the reference ADC is divided between the shared portion of the reference slice 601 and the partial reference slice 610, 612, 614, 616, the combination of (1) the partial reference slice 610, 612, 614, 616 being serviced by the shared portion 601 and (2) the shared portion of the reference slice 601, operate together to output a value representing the samples taken by the partial reference slice 610, 612, 614, 616 during the time the shared portion 601 is servicing that partial reference slice 610, 612, 614, 616. This value can then be used as a reference to normalize the active slice 620, 622, 624, 626 associated with the partial reference slice 610, 612, 614, 616 (i.e., that active slice that is taking a sample at the same time as the partial reference slice).

In accordance with one embodiment of the disclosed method and apparatus, the reference slice selection signal 805 is the output of a two bit counter that increments every eight clock cycles of the master clock 903 (see FIG. 9). In the embodiment shown in the timing diagram of FIG. 9, the shared portion of the reference slice 601 requires eight clock cycles to process the sample. A first 4:1 multiplexer (mux) 811 selects between the four reference slice clocks 704, 903, 905, 907 based on the state of the reference slice selection signal 805. The output from the comparator 715 within each of the four partial reference slices is coupled to one of the four inputs of a second 4:1 mux 813. The second mux 813 selects one of the four signals to be coupled to the SAR 803 based on the reference slice selection signal 805. A 1:4 mux 815 routes the analog output from the DAC 801 to one of the four partial reference slices 810, 812, 814, 816. The mux 815 is controlled by the reference slice selection signal 805. Accordingly, when the shared portion of the reference slice 601 is servicing the first partial reference slice 610, each of the three multiplexers, 811, 813, 815 are set to couple the SAR 803 and the DAC 801 to that particular partial reference slice 610.

In one embodiment of the disclosed method and apparatus, the reference slice selection signal 805 indicates which partial reference slice 610, 612, 614, 616 the shared portion of the reference slice 601 is servicing. In the example shown in FIG. 9, during the first eight clock cycles of the master clock 903, the first slice 610 is serviced by the shared portion of the reference slice 601. That is, the three multiplexers 811, 813, 815 are set to pass the signals associated with the first partial reference slice 610. It should be noted that the order in which each partial reference slice 610, 612, 614, 616 samples could differ from that shown. That is, while the reference slice selection signal 805 is shown as a clock that increments, in an alternative embodiment, the reference slice selection signal 805 is generated by a pseudo random generator. Other sequences and patterns are also possible.

The SAR 803 is initialized to set the most significant bit (MSB) D, of its output to a value of logical one (not shown in FIG. 9). Each of the other bits Di through D1 are set to a logical zero. These output bits are coupled to the input of the DAC 801. The DAC 801 accordingly, outputs an analog voltage 706 that is equal to half the full scale DAC voltage as set by the reference signal 807. The output 706 of the mux 815 is coupled to the comparator 715 within the partial reference slice 610 (see FIG. 7). The comparator 715 outputs a signal 708 to an input of the mux 813. The mux 813 passes that output to the SAR 803 when the reference slice selection signal 805 indicates that the shared portion of the reference slice 601 is servicing the first partial reference slice 602. The SAR 803 uses the value of the output to appropriately set the output bits Di through Dn_1 in the manner discussed above with regard to FIG. IA. The process continues under the control of the SAR 803 until the value representing the input 710 to the THA 703 (see FIG. 7) is represented at the output 632 of the shared portion of the reference slice 601. This process should take no more than eight cycles of the master clock in the embodiment shown in FIG. 9. However, in an alternative embodiment, the SAR 803 may be much slower than the active ADC 700 and so require several more cycles of the master clock. In such an embodiment, the timing will be extended so reference samples are not taken as often. That is, a reference sample is shown to be taken every 9 cycles of the master clock in FIG. 9. In an alternative embodiment, reference samples may be every 17 cycles of the reference clock (i.e., 16+1 cycles).

The reference slice 1 clock 704 (see FIG. 9) is coupled to the THA 703. The reference slice 1 clock 704 determines when to track and hold a sample of the output by the THA 702. The reference slice 1 clock 704 is synchronized to the master clock 903. The master clock 903 runs at least at the Nyquist rate (i.e., twice the rate of the highest frequency of interest in the input signal 621). Each of the Slice clocks 620, 622, 624, 626 run at the rate of the master clock 903 divided by the number of slices. Each time a sample is taken by one of the reference THA 703 within one of the partial reference slices 610, 612, 614, 616, the analog to digital conversion process will run to completion with an output value being provided at the output 632.

Each active slice 602, 604, 606, 608 takes and holds a sample once every M cycles of the master clock. The clock 620, 622, 624, 626 for each active slice 602, 604, 606, 608 runs at a rate that is 11M times the rate of the master clock 903, where M is the number of slices. The reference slice clocks 704, 903, 905, 907 each run at a slower rate than the slice clocks. In the example shown in FIG. 9, the reference clocks run at 1/(2M) times the rate of the slice clocks. Therefore, the partial reference slices 610, 613, 614, 616 each take a sample at a rate that is 1/(2M) times that of the active slices 602, 604, 606, 616. It should be noted that the portion of the reference slice that is shared can only handle one partial reference slice 610, 613, 614, 616 at a time. It should also be noted that in an alternative embodiment in which the SAR 803 within the shared portion of the reference slice is slower, the amount of time between reference samples will be longer (i.e., a greater number of active samples are taken in the time between reference samples).

In one embodiment of the disclosed method and apparatus, the shared portion of the reference slice 601 services the partial reference slice 610 for several samples before servicing the next partial reference slice 613. Taking more reference measurements before servicing the next partial reference slice 612 allows for better performance, generally. In that case, the rate at which the reference slice selection signal 805 increments is slower than shown in FIG. 9. The speed at which the reference slice selection signal 805 is incremented is set to any value that provides sufficient input to the partial reference slice 610, 612, 614, 616 to allow corrections to be generated. In one embodiment, the reference slice selection signal 805 increments every 16 cycles of the master clock 903. Accordingly, the shared portion of the reference slice 601 will service the first partial reference slice 610 for eight cycles of the master clock 903. During those eight cycles, the first active slice 602 will take two samples and accordingly outputs two values. That is, each active slice 602, 604, 606, 608 takes a sample every 4 cycles of the master clock 903 (see FIG. 9). Note that a slice sample is taken by one of the active slices each cycle of the master clock 903. However, each particular active slice will only take one sample and then for the next 3 cycles, the other three active slices will take their samples. Thus the interleaving of the slices.

Within the same eight master clock cycles, the partial reference slice 610 will take one sample. The shared portion of the reference slice 601 will output one value. The partial reference slice 610 takes one reference sample for each two slice samples taken by the active slice 602 during the eight master clock cycles for which that partial reference slice is serviced by the shared portion of the reference slice 601. The first such sample is taken concurrent with the slice 1 clock 620 (i.e., the time when the active slice 602 is acquiring a sample). At the end of the eight cycles of the master clock 903, the shared portion of the reference slice 601 will begin servicing the second slice 604. The second active slice 604 will take two samples and so output two digital values representing the amplitude of the input signal at each slice 2 sample time during the next eight master clock cycles. The second partial reference slice 612 will take one sample during this time. The shared portion of the reference slice 601 will output one digital value representing the amplitude of the input signal, one for each two values output from the second active slice 604. The value will be determined based on a sample taken concurrent with the sample time indicated by the slice 2 clock 622 (i.e., the time when the second active slice 604 is sampling the output of the THA 702).

In accordance with one embodiment of the disclosed method and apparatus, each THA 703 in each partial reference slice 610, 612, 614, 616 will continue to take samples at the reference sample rate even when the shared portion of the reference slice 601 is servicing one of the other partial reference slices 610, 612, 614, 616.

The Reconstruction Interleaver 618 will compare the reference values provided by each shared portion of the reference slice 601 to the values taken by the associated active slice 602, 604, 606, 608 and calibrate and interleave the values to construct a digital interleaved representation of the signal that was input to the ADC 600 having a sample rate that is equal to the master clock rate.

Therefore, it can be seen that each active slice is associated with a partial reference slice (i.e., the reference THA 703 and the reference comparator 715), while another portion of the reference slice (i.e., the DAC 801 and the SAR 803) is shared among the partial reference slices. In an alternative embodiment, the comparator is part of the shared portion of the reference slice.

Each reference THA 703 will continue to take samples at the reference rate, even when the samples from that particular THA are not being used (i.e., the shared portion of the reference sample is busy servicing one of the other partial reference slices). Therefore, the distortion that occurs in prior art time interleaved ADCs due to the uneven loading due to the sharing of the reference slice (see FIG. 4), is avoided. Nonetheless, since reference samples are taken at a rate that is less than one half that of the active THA 701, this embodiment of the disclosed method and apparatus will still suffer from distortion caused by uneven loading due to the difference between the load on the input when a slice THA 702 and a reference THAs 703 are both taking samples and the load when only a slice THA 702 is taking a sample. That is, even with this improvement in the balance of the load on the input, the input is not loaded by a reference THA 703 for 8 of the 9 sample cycles of the active slice.

Figure 10:
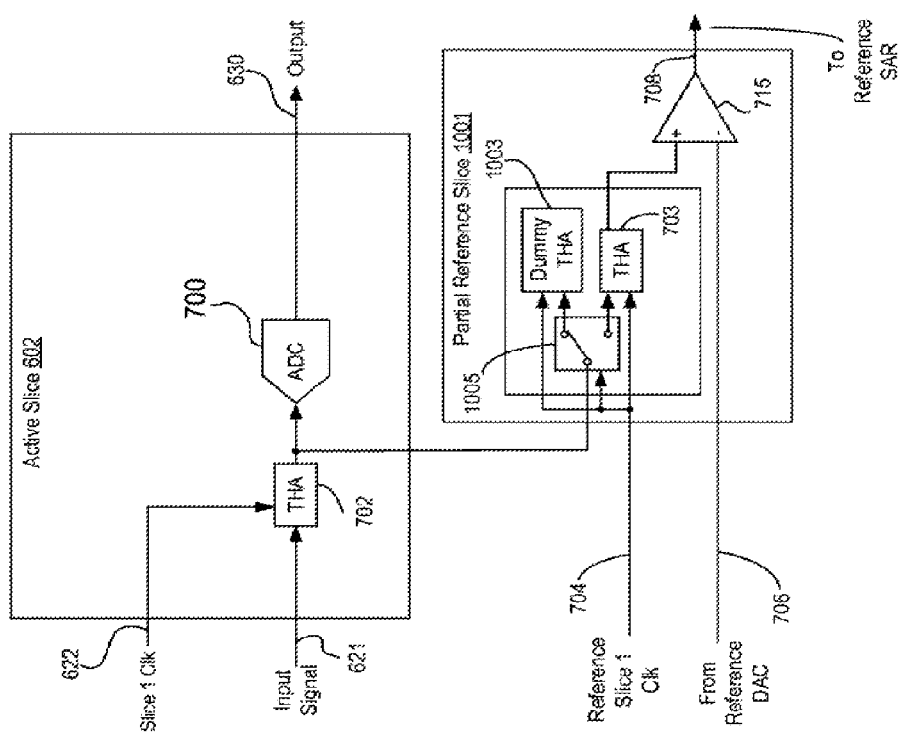
FIG. 10 is a simplified block diagram of an active slice coupled to a partial reference slice having a reference track and Hold amplifier (THA) and a dummy THA.

FIG. 10 is a simplified block diagram of an active slice 602 coupled to a partial reference slice 1001. The partial reference slice 1001 has both a reference THA 703 and a "dummy" THA 1003. The dummy THA 1003 presents a dummy load having an impedance that is equal to the impedance of the reference THA 703. In accordance this embodiment, the partial reference slice 1001 is used in the time interleaved ADC 600 of FIG. 6 in place of the partial reference slice 610 of FIG. 7. The reference slice 1 clock 704 not only determines when the THA 703 will take samples, but also whether a switch 1005 will connect the reference THA 703 or the dummy THA 1003 to the output of the THA 702 of the active slice 602. In FIG. 9, a slice 1 dummy clock 908 shows when the dummy THA 1003 will sample. For each sample time during which the reference THA 703 is not actively sampling 909, 911, 913, 915, 917, 919, 921, 923 (see FIG. 9) the switch 1005 will couple the output of the THA 702 to the dummy THA 1003 and the dummy THA 1003 will take a sample. Therefore, the load at the output of the THA 702 will be identical for each sample taken by the THA 702, whether the reference slice is sampling the output of the THA 702 or not.

Figure 11:
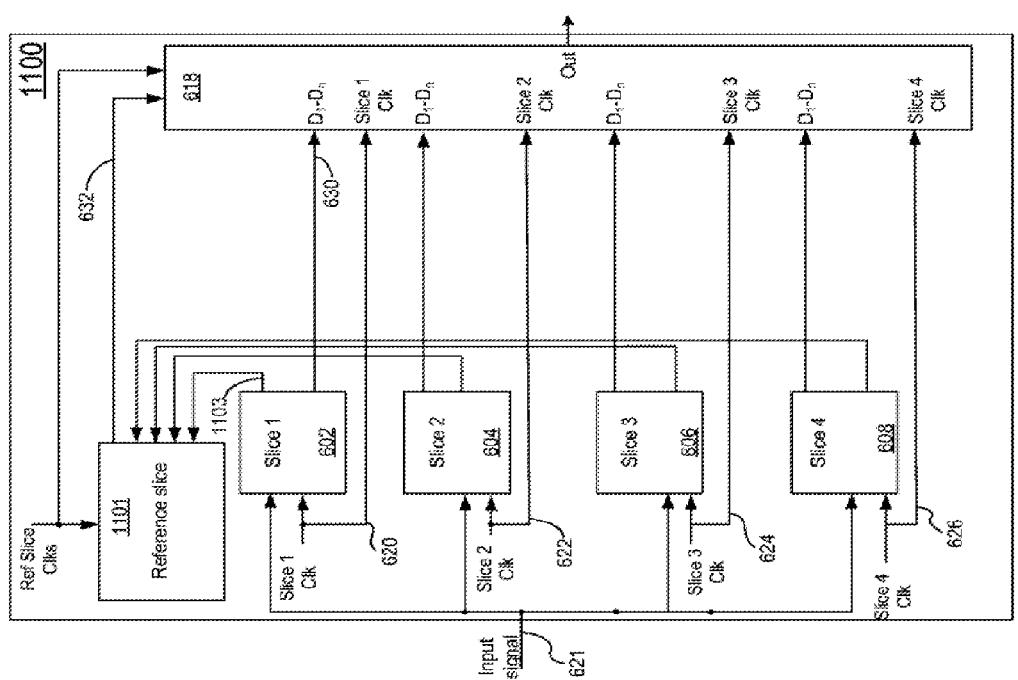
FIG. 11 is a simplified block diagram of a reference slice used in the ADC of FIG. 10.

FIG. 11 is a simplified block diagram of a time interleaved ADC 1100 in accordance with an embodiment of the disclosed method and apparatus. A reference slice 1101 includes a plurality of reference THAs, each associated with a corresponding one of the active slice 602, 604, 606, 608.

Figure 12:
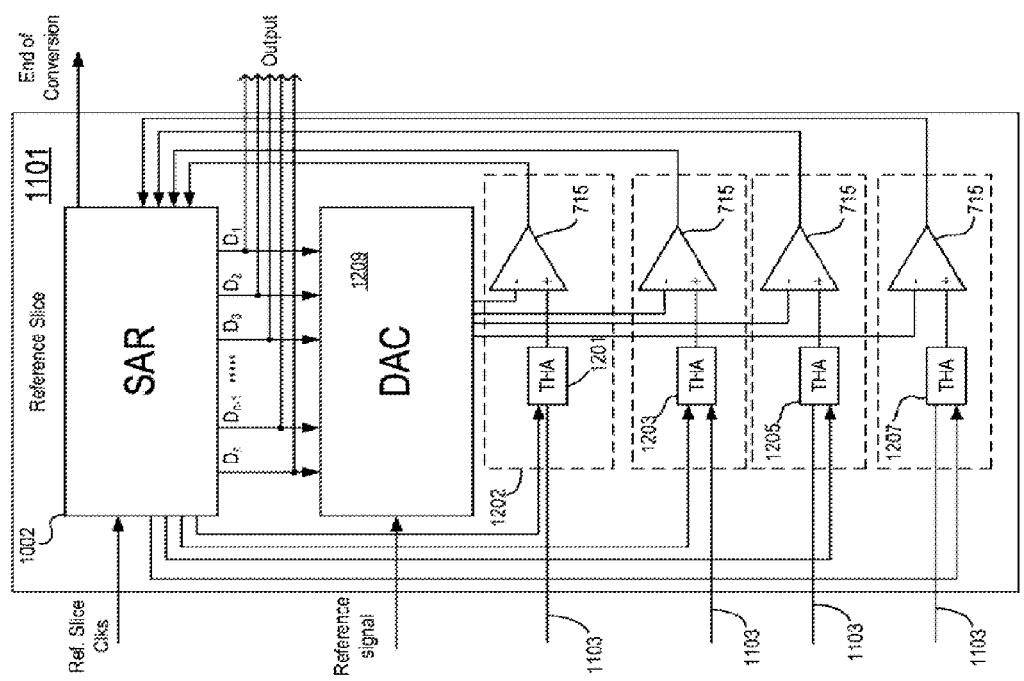
FIG. 12 is a simplified block diagram of the reference slice of FIG. 11.

FIG. 12 is a simplified block diagram of the reference slice 1101. The embodiment of FIG. 11 functions in similar fashion to the time interleaved ADC of FIG. 6. However, rather than having a plurality of partial reference slices 610, 612, 614, 616, each having a reference THA 703 and a comparator 715, as is shown in FIGS. 6-8, the reference slice 1101 includes a plurality of reference slice input modules 1202. In accordance with one alternative embodiment (not shown), each reference slice input module 1202 comprises a reference THA 1201, 1203, 1205, 1207. In this case, the comparator 715, like the SAR 1002 and the DAC 1209, is shared by each of the reference slice input modules 1202. Accordingly, the reference ADC comprises a shared comparator 715, the shared SAR 1002 and the shared DAC 1209.

In the embodiment shown in FIGS. 11 and 12, the SAR 1002 and the DAC 1209 are shared by each of the reference slice input modules 1202, however, there is one comparator 715 associated with each THA 1201, 1203, 1205, 1207. Accordingly, in similar fashion to that shown in FIG. 8, the SAR 1002 and the DAC 1209 include multiplexers (not shown for the sake of simplicity). The multiplexers are similar to the multiplexers 811, 813 and 815 shown in FIG. 8. They select the appropriate signals to be applied to the SAR 1002 and output from the DAC 1209, as well as to select which timing signals to use. In one embodiment in which the comparator 715 is shared, a multiplexer (not shown) similar to the multiplexer 815 shown in FIG. 8 is used to select which THA 1201, 1203, 1205, 1207 to connect to the input to the comparator 715 as a function of a reference slice selection signal.

In the embodiment shown in FIG. 12, each reference slice input module 1202 includes a comparator 715. The combination of a comparator 715 together with the SAR 1002 and the DAC 1209 forms the reference ADC when the SAR 1002 and the DAC 1209 are servicing the active slice that is associated with that reference slice input module 1202. In accordance with one embodiment of the disclosed method and apparatus, the reference slice input modules 1202 are integrated into the reference slice 1101. In one embodiment, reference slice clocks that control the timing of the samples to be taken by each reference THAs 1201, 1203, 1205, 1207 are coupled to the reference slice 1101 from a clock signal generator (not shown) used to generate each slice clock 620, 622, 624, 626. Alternatively, the reference slice clocks are generated within the reference slice based on a master clock used to generate each slice clock 620, 622, 624, 626.

The reference slice 1101 has a plurality of reference THAs 1201, 1203, 1205, 1207, each associated with a corresponding one of the active slices 602, 604, 606, 608. Each active slice 602, 604, 606, 608 has an output 1103 taken from the output of the active THA 702 (see FIG. 7) within the active slice. Each output 1103 is coupled to a respective input of one of the plurality of reference THAs 1201, 1203, 1205, 1205.

Having one reference THA 1201, 1203, 1205, 1205 for each active slice 602, 604, 606, 608 means that all of the reference THAs 1201, 1203, 1205, 1205 present a load on the output of associated active THA 702 within the associated slice even when a shared DAC 1209 is processing samples taken by one of the other three reference THAs 1201, 1203, 1205, 1205. Nonetheless, this still leaves distortion resulting from the fact that the reference slice 1101 is slower than the active slices 602, 604, 606, 608. That is, in one embodiment, the reference THAs 1201, 1203, 1205, 1205 take samples at a rate that is 1/9th the rate of the active slices. Therefore, the loading on the output of the active THA 702 in each active slice 602, 604, 606, 608 will change every 9t1 (i.e., when one of the reference THAs 1201, 1203, 1205, 1205 is sampling).

In one embodiment of the disclosed method and apparatus, a dummy THA, such as that used in the partial reference slice 1001 shown in FIG. 10 is used. The dummy THA is used to present the same load on the output of the active THA 702 within each active slice 602, 604, 606, 608 as is present during each sample time of the active THA 702, as was discussed with regarding to FIG. 10 above.

Figure 13:
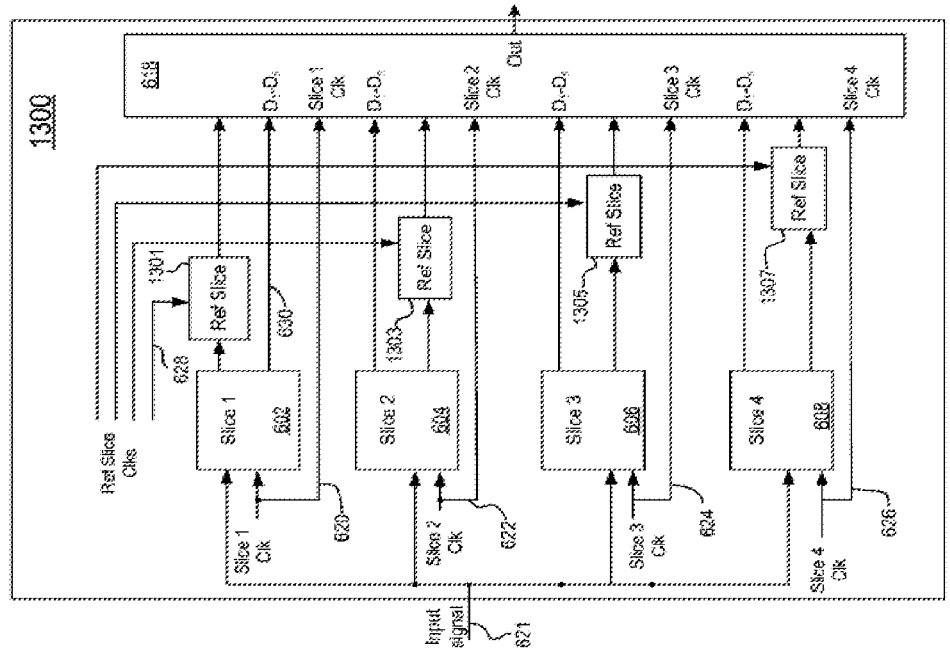
FIG. 13 is a simplified block diagram of one embodiment of the disclosed method and apparatus in which one full reference slice is associated with a corresponding one of the active slices.

FIG. 13 is a simplified block diagram of one embodiment of the disclosed method and apparatus in which one full reference slice 1301, 1303, 1305, 1307 is associated with a corresponding one of the active slices 602, 604, 606, 608. As is the case with the other figures, the origin of clock signals are not shown. Nonetheless, those skilled in the art will understand that the clocks can be generated by a clock generator. In one such embodiment, the clock generator synchronizes the operation of each of the active slices and each of the reference slices based on the timing of a master clock that runs at a frequency that is at least as great as the Nyquist criteria for the highest frequency signals to be converted from analog format to digital format.

Figure 14:
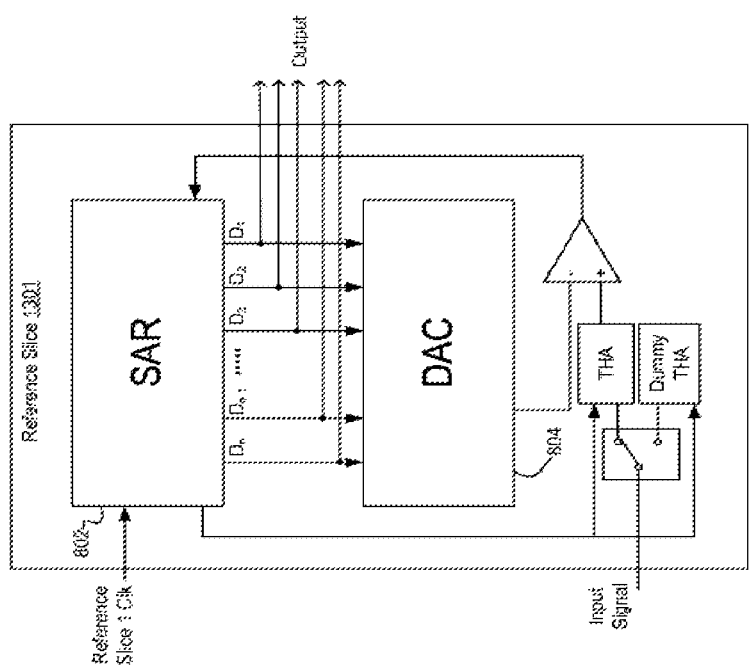
FIG. 14 is a simplified block diagram of a reference slice used in the time interleaved ADC of FIG. 13.

FIG. 14 is a simplified block diagram of a reference slice 1301. While the ADC of FIG. 14 is shown as a SAR ADC, as is the case with regard to the ADCs discussed above, it will be understood by those skilled in the art that any type of ADC can be used. The reference slice 1301 is shown with a dummy THA 1401 and a reference THA 703. In an alternative embodiment, no dummy THA is provided. In the embodiment in which the dummy THA 1401 is used, the timing of the dummy THA 1401 will be as discussed with regard to the dummy THA 1003 shown in the partial reference slice of FIG. 10.

While various embodiments of the disclosed method and apparatus have been described above, it should be understood that they have been presented by way of example only, and should not limit the claimed invention. Likewise, the various diagrams may depict an example architectural or other configuration for the disclosed method and apparatus. This is done to aid in understanding the features and functionality that can be included in the disclosed method and apparatus. The claimed invention is not restricted to the illustrated example architectures or configurations. Rather, the desired features can be implemented using a variety of alternative architectures and configurations. Indeed, it will be apparent to one of skill in the art in light of the disclosure presented herein, how alternative functional, logical or physical partitioning and configurations can be implemented to implement the desired features of the disclosed method and apparatus. Also, a multitude of different constituent module names other than those depicted herein can be applied to the various elements of the disclosed method and apparatus.

Although the disclosed method and apparatus is described above in terms of various embodiments and implementations, it should be understood that the various features, aspects and functionality described in one or more of the individual embodiments are not limited in their applicability to the particular embodiment with which they are described. Thus, the breadth and scope of the claimed invention should not be limited by any of the above-described embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide specific examples of the type of the item in discussion, not an exhaustive or limiting list thereof; the terms "a" or "an" should be read as meaning "at least one," "one or more" or the like.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of examples of block diagrams and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A system for processing signals, said system comprising:
    a time interleaved analog-to-digital converter (ADC) for converting analog signals to digital signals, said time interleaved ADC comprising:
        a) a plurality of active slices; and
        b) a plurality of reference slices, each reference slice associated with a corresponding one of the plurality of active slices;
    wherein an output of each reference slice is used to correct distortion in an output of the corresponding active slice.

2. The system of claim 1, wherein the each active slice samples an input signal at a first rate and each associated reference slice samples the input signal at a second rate, the second rate being slower than the first rate and wherein each sample taken by one of the plurality of reference slices is taken concurrent with a sample taken by the associated active slice.

3. The system of claim 2, wherein each reference slice comprises a reference sampling module and a dummy load, the reference slice using the reference sampling module to sample the input signal and the dummy load providing a load to the input signal when the sampling module is not sampling the input concurrent with the active slice.

4. The system of claim 3, wherein the sampling module is a track and hold amplifier.

5. The system of claim 3, wherein at least one of the plurality of active slices includes a sampling module and an associated pipeline ADC coupled to the associated sampling module.

6. The system of claim 5, wherein at least one of the plurality of reference slices includes a successive approximation register (SAR) ADC associated with the reference sampling module, the SAR ADC being coupled to the associated reference sampling module.

7. A system for processing signals, said system comprising:
    a time interleaved analog-to-digital-converter (ADC), said ADC comprising:
        a) a plurality of active slices, each active slice receiving an input signal, taking a sample of the input signal and outputting a digital value representing the input signal at a time the sample was taken;
        b) a plurality of partial reference slices, each of the plurality of partial reference slices associated with a corresponding one of the active slices, each partial reference slice taking a sample of the input signal concurrent with the associated active slice; and
        c) a shared portion of a reference slice coupled to each of the plurality of partial reference slices and receiving the samples taken by each partial reference slice, the shared portion of the reference slice servicing one of the plurality of partial reference slices at a time such that the combination of partial reference slice being serviced by the shared portion, and the shared portion of the reference slice, operate together to output a value representing the samples taken by the partial reference slice during the time the shared portion of the reference slice is servicing that partial reference slice.

8. The system of claim 7, wherein the shared portion of the reference slice comprises a successive approximation (SAR) module and a digital to analog converter (DAC), and at least one of the plurality of partial reference slices comprises a comparator to compare output of the DAC to the sample taken by the corresponding active slice.

9. The system of claim 7, further comprising an interleaver, the interleaver receiving each of the digital values representing the samples, calibrating the values from the active slices to reduce distortion due to differences between the active slices and interleaving the values to form a digital representation of the input signal.

10. The system of claim 7, wherein the each active slice samples an input signal at a first rate and each associated partial reference slice samples the input signal at a second rate, the second rate being slower than the first rate and wherein each sample taken by one of the plurality of partial reference slices is taken concurrent with a sample taken by the associated active slice.

11. The system of claim 10, wherein each partial reference slice comprises a reference sampling module and a dummy load, the partial reference slice using the reference sampling module to sample the input signal and the dummy load providing a load to the input signal when the sampling module is not sampling the input concurrent with the active slice.

12. The system of claim 11, wherein at least one of the plurality of active slices includes a sampling module and an associated pipeline ADC coupled to the associated sampling module.

13. The system of claim 12, wherein at least one of the plurality of partial reference slices includes a SAR ADC associated with the reference sampling module, the SAR ADC being coupled to the associated reference sampling module.

14. The system of claim 13, wherein the sample of the input signal taken by each partial reference slice is a sample of the sample taken by the associated active slice.

15. A system for processing signals, said system comprising:
    a time interleaved analog-to-digital converter (ADC), said time interleaved ADC comprising:
        a) a plurality of active slices, each active slice:
            i. receiving an input signal,
            ii. taking a sample of the input signal; and
            iii. outputting a digital value representing the input signal at the time the sample was taken; and
        b) a reference slice comprising:
            i. a plurality of reference slice input modules, each reference slice input module associated with a corresponding one of the active slices, each reference slice input module taking a sample of the input signal concurrent with the at least one sample taken by the associated active slice; and ii. a reference ADC, the reference ADC receiving the samples taken by each reference slice input module, the reference ADC servicing one of the plurality of reference slice input modules at a time by outputting a digital value representing the samples taken by the reference slice input module during the time the reference ADC is servicing that reference slice input module.

16. The system of claim 15, wherein the reference slice input module includes a sampling module.

17. The system of claim 15, wherein the reference slice input module includes a sampling module and a comparator, the comparator forming a part of the reference ADC.

18. A method for processing signals, the method comprising:

in a time interleaved analog-to-digital converter (ADC) comprising a plurality of active slices, each with an associated reference slice:
a) receiving an analog signal in the plurality of active slices;
b) receiving the analog signal in the associated reference slices; and
c) correcting distortion in the digital output of at least one of the plurality of active slices using a digital output of the reference slice associated with the at least one active slice.

19. The method of claim 18, comprising:
a) sampling the analog signal at a first rate with each active slice; and
b) sampling the analog signal at a second rate with each reference slice, the second rate being slower than the first rate, each sample taken by each of the plurality of reference slices being taken concurrent with a sample taken by the associated active slice.

20. The method of claim 19, comprising loading an output of each active slice with a dummy load during times when each active slice is taking a sample and the associated reference slice is not taking a sample.

21. The method of claim 20, wherein each active slice includes a pipeline ADC and each reference slice includes a SAR ADC.

22. A method for processing signals, the method comprising:

in a time interleaved analog-to-digital converter (ADC) comprising a plurality of active slices, each with associated partial reference slices:

a) receiving an input signal in the plurality of active slices;
b) taking a sample of the input signal with each of the plurality of active slices;
c) outputting a digital value representing the amplitude of the input signal at the time each sample was taken;
d) receiving the input signal in the plurality of partial reference slices;
e) taking a reference sample of the input signal concurrent with the sample taken by the associated active slice, the sample being taken with the corresponding partial reference slice; and
f) providing the reference sample to a shared portion of a reference slice, the shared portion of the reference slice servicing one of the plurality of partial reference slices at a time by outputting a digital value representing the samples taken by the partial reference slice during the time the shared portion of the reference slice is servicing that partial reference slice.

23. A tangible, non-transitory computer readable medium comprising executable code which, when executed by a processor, is operable to:

configure a time interleaved analog-to-digital-converter (ADC) comprising a plurality of active slices, each with a corresponding partial reference slice, to:
a) receive an input signal in the plurality of active slices;
b) take a sample of the input signal using each of the plurality of active slices;
c) output a digital value representing an amplitude of the input signal at a time each sample was taken;
d) receive the input signal in the corresponding partial reference slices;
e) take a reference sample of the input signal concurrent with the sample taken by the associated active slice, the sample being taken with the corresponding partial reference slice; and
f) provide the reference sample to a shared portion of a reference slice, the shared portion of the reference slice servicing one of the plurality of partial reference slices at a time, by outputting a digital value representing the samples taken by the partial reference slice during the time the shared portion of the reference slice is servicing that partial reference slice.

* * * * *

UNITED STATES PATENT AND TRADEMARK OFFICE
CERTIFICATE OF CORRECTION

PATENT NO. : 9,537,502 B2
APPLICATION NO. : 14/858793
DATED : May 30, 2017
INVENTOR(S) : Joseph Van Engelen, Aaron Buchwald and Ralph Duncan Page 1 of 1

It is certified that error appears in the above-identified patent and that said Letters Patent is hereby corrected as shown below:

On the Title Page

The "Applicant":
Delete "(71) Applicant: Luxtera, Inc., Carlsbad, CA (US)"
And Insert --(71) Applicant: Entropic Communications LLC, Carlsbad, CA (US)--

Signed and Sealed this
Twenty-fifth Day of December, 2018

Andrei Iancu
*Director of the United States Patent and Trademark Office*